(12) United States Patent
Heiland

(10) Patent No.: US 7,075,772 B2
(45) Date of Patent: Jul. 11, 2006

(54) ELECTROSTATIC GRIPPING DEVICE

(75) Inventor: Peter Heiland, Raunheim (DE)

(73) Assignee: Integrated Dynamics Engineering GmbH, Raunheim (DE)

( * ) Notice: Subject to any disclaimer, the term of this patent is extended or adjusted under 35 U.S.C. 154(b) by 320 days.

(21) Appl. No.: 10/613,870

(22) Filed: Jul. 5, 2003

(65) Prior Publication Data

US 2004/0060172 A1    Apr. 1, 2004

(30) Foreign Application Priority Data

Jul. 15, 2002    (DE)    ................. 102 32 080

(51) Int. Cl.
*H02H 1/00*    (2006.01)
*H01F 13/00*    (2006.01)

(52) U.S. Cl. ............... 361/234; 361/758; 361/235; 361/145; 29/744; 29/825; 279/128; 269/8

(58) Field of Classification Search .......... 29/729, 29/739–744, 825; 361/234, 758, 235, 145; 324/758; 438/14; 414/217, 935; 279/128; 269/8, 903; 294/64.1
See application file for complete search history.

(56) References Cited

U.S. PATENT DOCUMENTS

| 4,822,091 | A | * | 4/1989 | Vermeer et al. | ............ 294/86.4 |
|---|---|---|---|---|---|
| 5,103,367 | A | * | 4/1992 | Horwitz et al. | ............. 361/234 |
| 5,880,924 | A | * | 3/1999 | Kumar et al. | ................ 361/234 |
| 6,075,375 | A | * | 6/2000 | Burkhart et al. | ............ 324/758 |
| 6,272,002 | B1 | * | 8/2001 | Mogi et al. | ................. 361/234 |
| 6,557,248 | B1 | * | 5/2003 | Shamouilian et al. | ......... 29/825 |
| 6,602,813 | B1 | * | 8/2003 | Shinji et al. | ................. 501/103 |
| 6,678,143 | B1 | * | 1/2004 | Masuda et al. | ............. 361/234 |
| 2004/0060172 | A1 | * | 4/2004 | Heiland | ....................... 29/825 |

* cited by examiner

*Primary Examiner*—Minh Trinh

(57) ABSTRACT

An electrostatic gripper for moving wafers includes bipolar electrodes with an insulating layer of zirconium oxide, which are positioned on a circuit board. The gripper is produced by a pressing process and can be operated with a DC voltage of less than 900 V. As a result, heating of the wafer is almost completely prevented even under a vacuum.

19 Claims, 4 Drawing Sheets

ELECTROSTATIC GRIPPING DEVICE

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention relates to a gripper that operates electrostatically, in particular for use in the semiconductor industry, and to a process for producing a gripper of this type.

TECHNICAL FIELD

On the one hand mechanical grippers are used to grip wafers. This technique is highly complex in particular for small components and may lead to damage and contamination of the wafer.

Alternatively, vacuum grippers that can suck up the wafer by means of reduced pressure and can convey it in this way are used. However, the constant reduction of the sizes of the structures used in the semiconductor industry means that production is more and more being carried out in a vacuum environment. Of course, vacuum grippers can then no longer be used.

Other grippers work using the principle of electrostatic attraction.

In this case, a voltage can be applied to the wafer and an opposite voltage can be applied to the gripper. On account of the electrostatic attraction, the wafer can be lifted and moved. A drawback of this principle is that the wafer has to be electrically conductive in order for the voltage to be applied. Therefore, to grip nonconductive (dielectric) wafers, there are electrostatic grippers which, like the gripper according to the invention, have electrodes arranged adjacent to one another. This principle too has long formed part of the prior art. For example, U.S. Pat. No. 4,184,188 (Briglia) and U.S. Pat. No. 4,399,016 (Tsukuda) have described a gripper that operates on the basis of this principle.

To lift the wafer, an opposite voltage is applied to adjacent, oppositely polarized electrodes. The electrodes then have a different charge than the component that is to be lifted, which leads to a force as a result of electrostatic attraction. As a result of this force, the wafer remains hanging from the gripper and can then be moved. To put the component down again, the electrodes are grounded.

A drawback of the known grippers of this principle is that a current flows in the wafer on account of the voltage differences, this current being dependent on the conductivity of the wafer and the level of the voltage. This current leads to heating of the wafer as a function of its geometry and conductivity and of the voltage applied. On account of this heating, the wafer may be distorted and damaged. This problem exists on account of the absence of convection in particular in a vacuum.

A further problem with the use of an electrostatic gripper in vacuo are changes in the spark-over voltage which, although it is over 2000 V/mm both in high vacuum and at atmospheric pressure, between these pressures falls to 6 V/mm on account of the longer mean clear distance.

A further drawback of high voltages is that the associated high potential means that the wafers are rapidly contaminated by attracted duct particles, etc.

SUMMARY OF THE INVENTION

It is an object of the invention to develop an electrostatic gripper that reduces the heating of the wafer to a minimum level and can be operated with the lowest possible voltage.

This object is achieved by a gripper device for picking up, holding and/or conveying wafers, having a gripper element that is arranged on a circuit board, with the gripper element including at least one bipolar electrode pair to which voltage can be applied, and at least two gripper elements arranged on the circuit board, in which gripper elements the electrode pairs are provided with an insulating layer that predominantly comprises zirconium oxide, with certain additives being added to the zirconium if necessary in order to improve properties.

Furthermore, the invention relates to a process for producing an electrostatic gripper or gripper device that includes the steps of applying electrode pairs to a flexible circuit board; applying a mediation layer to the electrodes; applying a zirconium oxide layer to the mediation layer; applying an insulating layer to the other side of the electrode; and pressing the layer assembly.

In conventional grippers, aluminum (III) oxide is generally used as the insulating layer. A drawback is the low relative dielectric constant. This can be improved by means of additives (for example Al 418 produced by Toto). However, a drawback in this case is that the material has a thickness of approximately 1 mm, with the result that complex grinding work is necessary in order to achieve a desired thickness of approximately 100 μm. The zirconium oxide which is used in the gripper according to the invention and is used, for example, to produce fuel cells is available in layer thicknesses of 50–300 μm and therefore requires little or no grinding. Layer thicknesses of below 50 μm are also conceivable and are achieved by grinding or by applying the zirconium oxide layer in a CVD or sputtering process. The latter method allows layer thicknesses in the region of a few atom diameters. A further advantage results from the higher hardness of the zirconium oxide compared to aluminum oxide. The layer is damaged less quickly both during production and in operation. Moreover, the layer remains smooth, with the result that damage to the wafer is avoided even after prolonged use. A further advantage is the very high resistivity of approx. $10^{14}$ Ωm so that the layer thickness can be kept very small.

Due to the low layer thicknesses and the relatively high dielectric constant, the gripper according to the invention can be operated with a DC voltage of only 200 to 900 V, which leads to greatly reduced currents in the wafer. By contrast, known electrostatic grippers are operated with voltages of between 1 and 6 kV.

Furthermore, the gripper according to the invention has two or more electrode pairs, which are applied to a circuit board. For example, the electrode pairs may be fitted at locations of the wafer that are insensitive to heating. The circuit board is used to hold the electrode pairs and at the same time includes the voltage supply.

The layer of the gripper according to the invention that predominantly comprises zirconium oxide may also contain a very wide range of additives. In this way it is possible to alter the mechanical and electrical properties.

In an embodiment of the invention, zirconium oxide stabilized with yttrium oxide has proven to be a suitable material for the insulating layer. However, an insulating layer comprising pure zirconium oxide is also conceivable.

A refinement of the invention has a holder comprising a flexible circuit board. In this way, the gripper can match the shape of the wafer.

This circuit board may expediently be a printed circuit board, which can be produced at low cost in one operation.

A refinement of the invention has electrode pairs that are round, rectangular or finger-shaped and therefore only take up a small area.

These electrode pairs may be constructed in such a way that one pole is surrounded by the other pole, for example in the form of a circle. This geometry is very compact compared to conventional designs, for example as adjacent conductor tracks as described in U.S. Pat. No. 4,184,188.

The gripper can expediently be operated at DC voltages of below 900 V. Voltages of as little as below 300 V are even conceivable as a result of a reduction in the layer thicknesses of the zirconium oxide and optimization of the geometry. This means that the heating of the wafer is minimal. Furthermore, in this way contamination to the wafer caused by attracted dust particles is reduced and the electric circuit used to operate the gripper becomes significantly simpler. The operating costs are also reduced on account of a lower power consumption.

In the refinement of the invention, an AC voltage can be applied for a brief period when the component is being released. This prevents the wafer from failing to be released as a result of any electrostatic charging which may be present.

In an embodiment, the electrode pairs are arranged at a distance from one another in such a way that the wafer can be gripped at the edge. In this way, the advantages of the compact structure of the electrode pairs are optimally utilized. The edge-side gripping allows heating in sensitive regions of the wafer to be reduced still further. For lifting purposes, according to a further embodiment the gripper has three electrode pairs that are arranged on a circular path, ideally at 120 degrees around the wafer. In this way, the weight of the wafer is uniformly distributed between the three electrode pairs.

Furthermore, the invention as described relates to a process for producing an electrostatic gripper, in which the electrostatic gripper includes one or more bipolar electrodes, comprising the steps of applying the electrode pairs to a flexible circuit board; applying a mediation layer to the electrodes; applying a zirconium oxide layer to the mediation layer; applying an insulating layer to the other side of the electrode; and pressing the layer assembly.

In this process, electrode pairs are applied to a flexible circuit board. Then, a mediation layer is applied to the electrodes. By way of example, indium is suitable for this mediation layer and may even have been applied to the electrodes in advance in a layer thickness of approx. 10 μm using an electrode deposition process. A layer of zinc is also able to improve the bonding of the various materials. The zirconium oxide layer is then applied to the indium layer. An insulating layer is applied to the other side of the electrode. Then, the layers are pressed together, so that they are joined to one another in a cold-welding operation. A rough surface of a zirconium oxide disk is of benefit to this operation.

Depending on the material used for the insulating layer, it may, as provided in a refinement of the process, be expedient for the insulating layer to be adhesively bonded or to use an insulating layer that has already been coated with adhesive.

As provided in one embodiment of the process, aluminum (III)oxide is particularly suitable as material for an insulating layer of this type. This is inexpensive and used as standard as insulating material in the semiconductor industry.

In one embodiment of the process, the electrode pairs are firstly applied to a further flexible circuit board, for example using an etching process. The electrode pairs are then fitted to the circuit board together with the further circuit board. Although this means that the gripper cannot be produced in one operation, this process is recommended if, on account of the geometry of the electrodes (e.g. very small, very short distance between the electrodes), production in one step is not technically feasible or entails a relatively high level of outlay.

BRIEF DESCRIPTION OF THE DRAWINGS

In the text that follows, the invention is explained on the basis of an embodiment and with reference to the drawings, FIGS. 1 to 5.

DETAILED DESCRIPTION OF THE INVENTION

Figure 1:
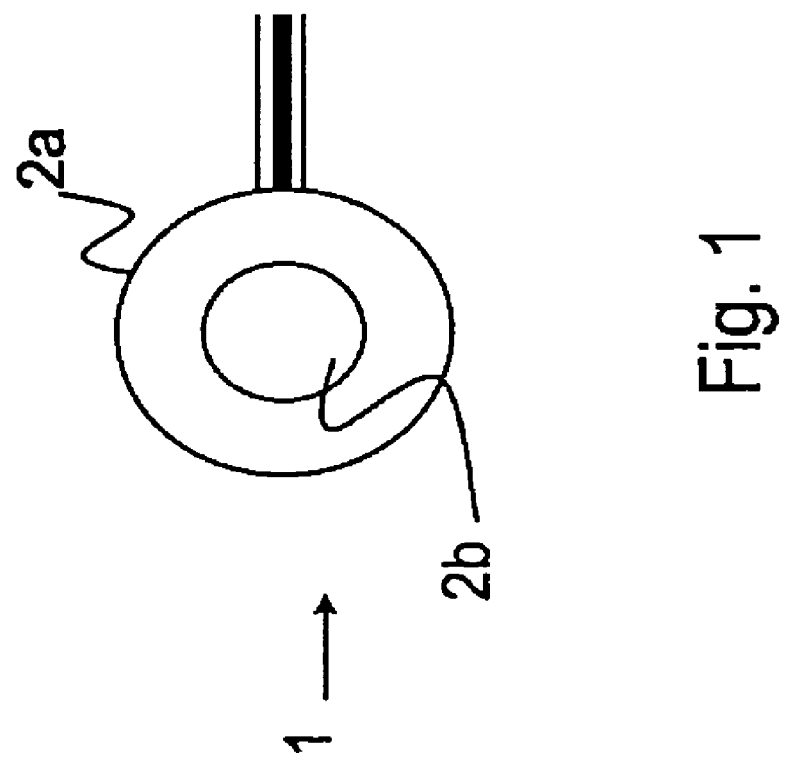
FIG. 1 shows a plan view of an electrode pair.

The bipolar electrodes 1, which can be seen in plan view in FIG. 1, comprise an outer ring 2 as an electrode that surrounds the other electrode 2b. The inner electrode 2b has its voltage supply 3 on the topside of the flexible printed circuit board 10 (FIG. 3).

Figure 2:
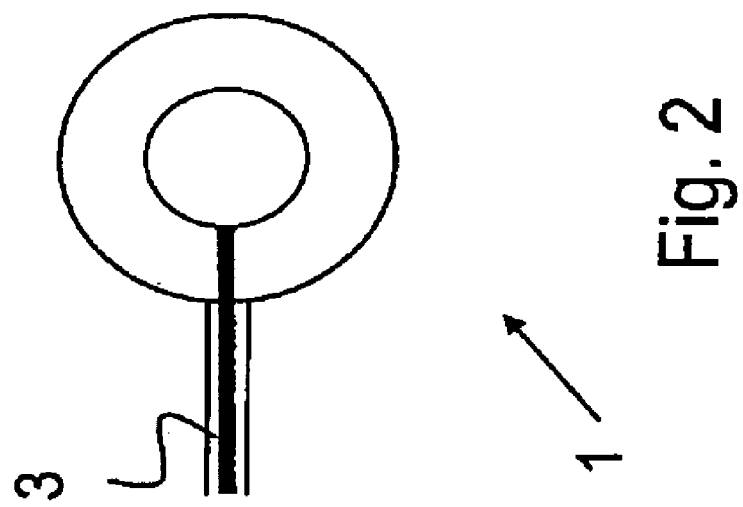
FIG. 2 shows a rear view of an electrode pair.

If the electrode is viewed from above (FIG. 2), the voltage supply 3 for the inner electrode can be seen. To pick up the wafer 5, a DC voltage is applied to the inner and outer electrodes. The electrostatic field that is then formed attracts the wafer 5.

Figure 3:
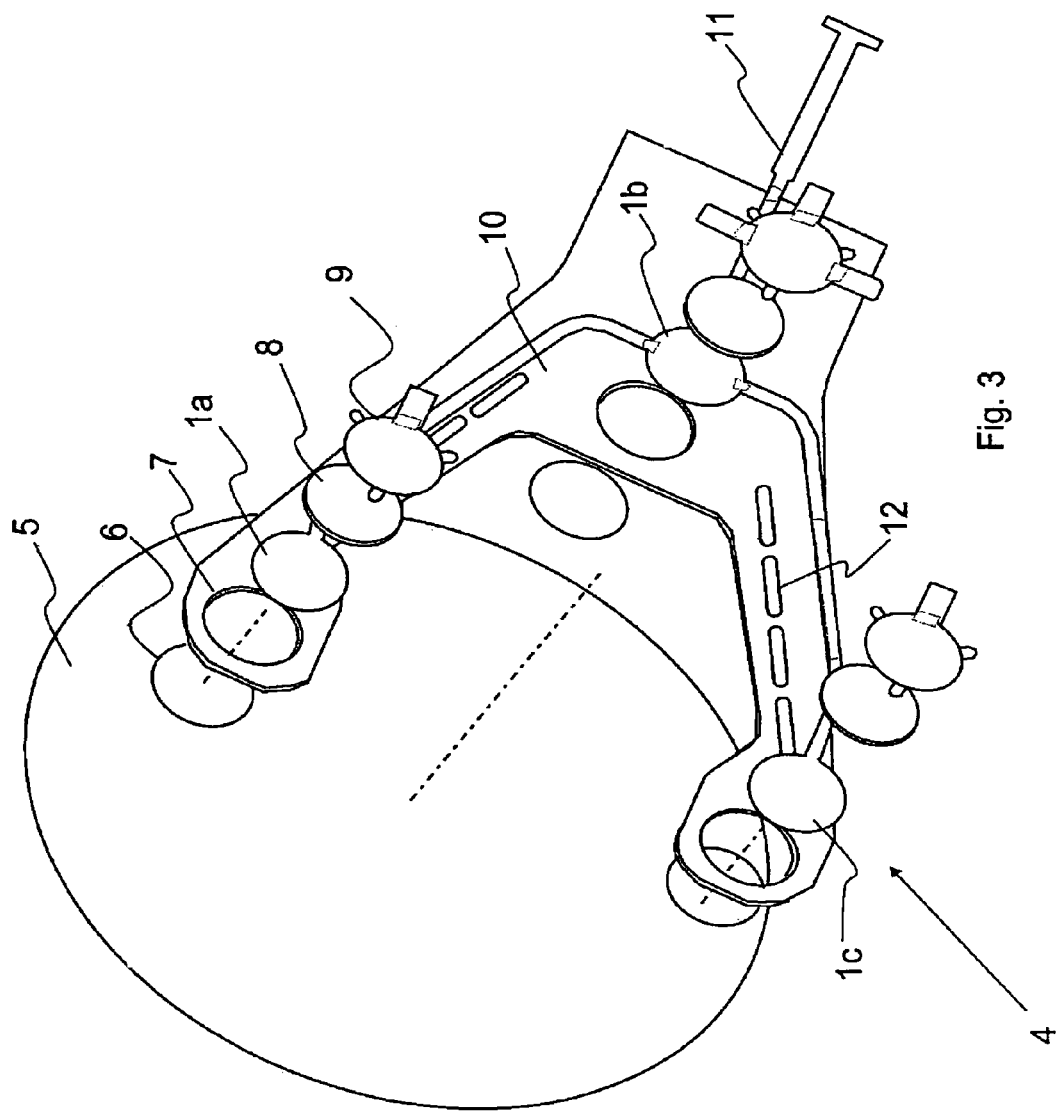
FIG. 3 shows the individual components of the electrostatic holder in an exploded view.

The electrostatic holder 4, an exploded view of which can be seen in FIG. 3, comprises the flexible printed circuit board 10, on which the conductor tracks 11 for the electrodes 1a–1c are printed. This illustration shows the individual layers of which the gripper consists before they are brought together. The individual layers (apart from the electrode pairs) are only provided with reference numerals for the upper gripper element.

Starting from the wafer 5, in front of this the figure shows an insulating layer of zirconium oxide 6, the circuit board 10, the electrodes 1a–1c and a further insulating layer 8 on the rear side, and also the baseplate 9.

In the circuit board 10, cutouts 7, 12 are provided for the conductor tracks and the electrodes as well as the insulating layer. The electrodes 1a–1c include the bipolar electrode pairs 2a,2b that can be seen in FIGS. 1 and 2. The conductor tracks 11 each comprise two lines for supplying voltage to the electrodes 1a–1c.

The layer structure described above, comprising an insulating layer of zirconium oxide 6, the bipolar electrode pairs 1a–1c, an insulating layer on the rear side 8 and a baseplate 9 for improving the stability, forms an electrostatic gripper element 13a–13c according to the invention.

In this embodiment, the insulating layer is provided with an adhesive film (not shown), so that the bonding is improved and inclusions of air are substantially prevented. The exemplary embodiment has three electrode pairs or gripper elements that are arranged at angles of 120° on a circular path. In this way, the wafer can be gripped at the edges if necessary.

Figure 4:
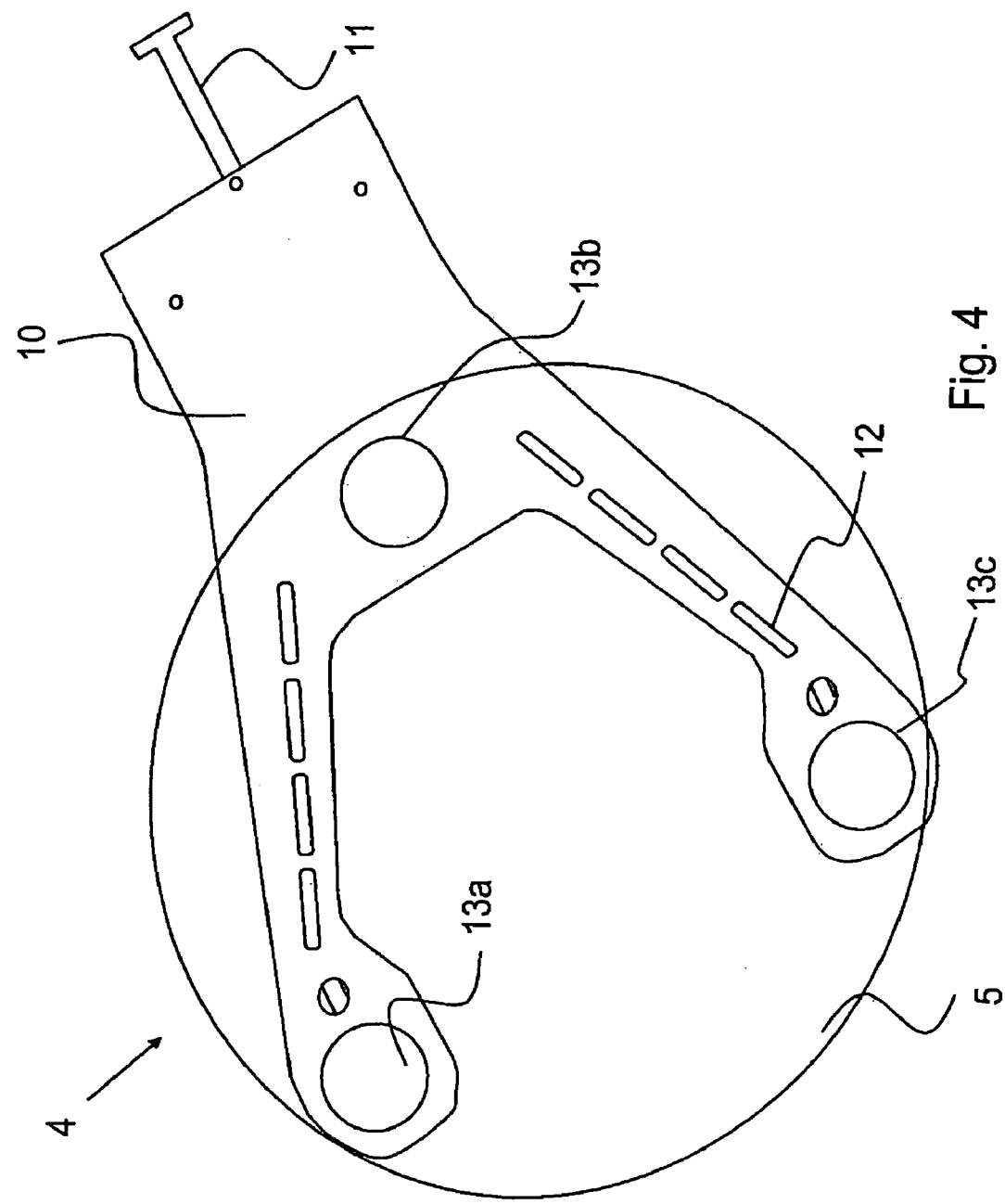
FIG. 4 shows the finished holder after the pressing operation.

After the pressing operation, in which the entire electrostatic gripper with all the gripper elements can be combined in a single operation, the layers are joined to one another as shown in FIG. 4. The gripper elements 13a–13c comprise the layer assembly illustrated above. The object of the pressing operation is to produce a cold weld. By way of example indium can be used as mediation layer (not shown) between the zirconium oxide layer 6 and the electrodes 1a–1c, in order to produce an optimum join between oxide layer and electrodes. Power is supplied through the conductor tracks 11 which are now present in the circuit board and the profile of which has been determined by the cutouts 12 which have previously been provided.

Figure 5:
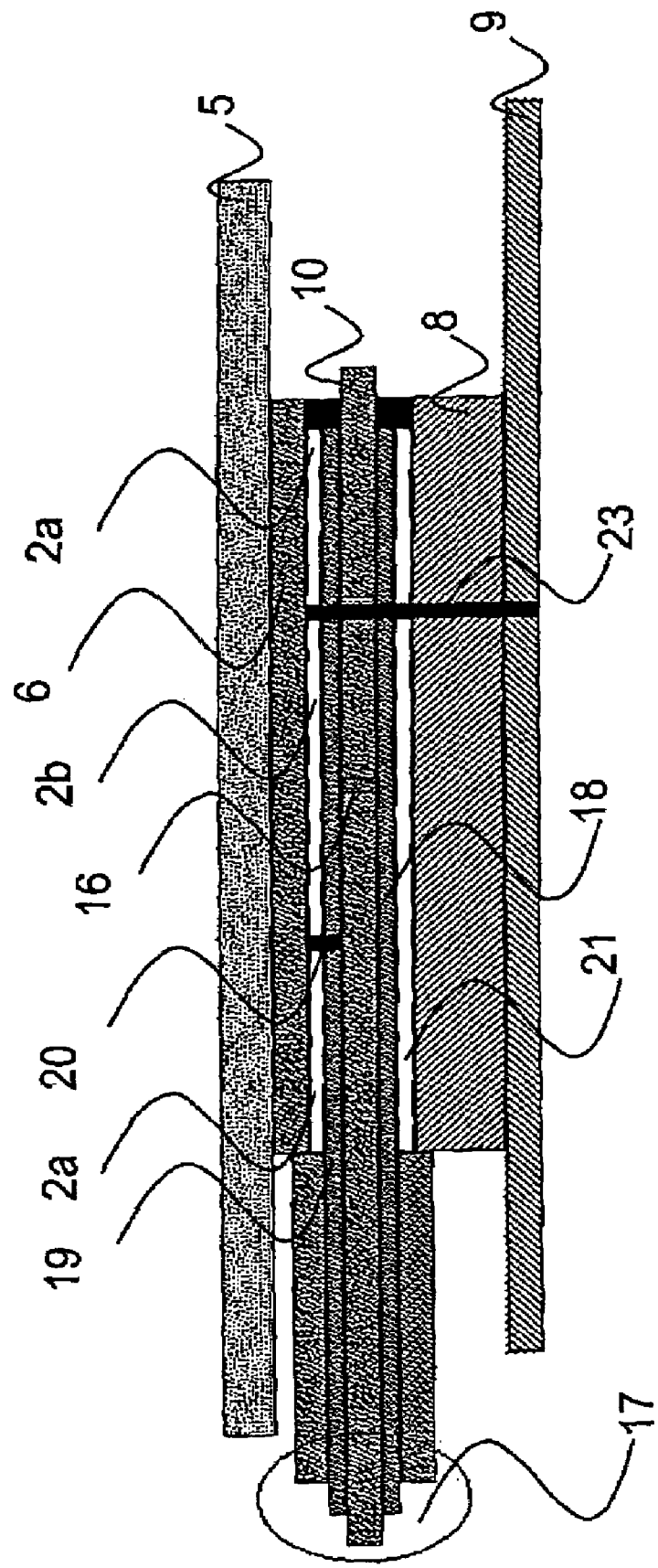
FIG. 5 shows a sectional view of a gripper element of the holder.

FIG. 5 shows a sectional view of a gripper element including a wafer that is being held. The top of the figure shows the wafer 5, below which is the insulating layer of zirconium oxide 6, followed by the bipolar electrode pair, comprising inner electrode 2b and outer electrode 2a, which are separated by a ring of insulating material 20. This is followed by the power supply to the outer electrode 15, which is provided via a conductive layer 19. Below this is the flexible circuit board 10 made from Kapton. The power is supplied to the inner electrode through the conductive layer 18 below the circuit board 10 and a connection through the circuit board 16, a conductive layer 21 below that is used to transfer it to further electrodes or gripper elements on the gripper. Below this is an insulating layer of aluminum(III) oxide 8, and right at the bottom is a stable baseplate 9. Furthermore, in this exemplary embodiment there is also a passage 13 for the introduction of insulating material. Such passages are used to introduce insulating material into the passages between the electrodes. At the voltage supply 17, the lower layer 18 is provided for the inner electrode and the upper layer 19 for the outer electrode.

In the present embodiment, the layer thicknesses and materials between the zirconium oxide layer and the insulating layer are as follows:

between 80 and 250 µm of zirconium oxide 6;

approx. 10 µm of indium and 5 µm of nickel as mediation layer between zirconium oxide layer and copper electrode;

approx. 17.5 µm of electrode and supply layers made from copper 14, 15, 21;

approx. 25 µm for the circuit board made from Kapton or polyamide 10;

approx. 2.6 µm for the insulating layer of aluminum oxide 8; and approx. 0.5 µm for the baseplate made from T 136 NiP 9.

The inner electrode has a diameter of 18 mm, and the outer electrode has an external diameter of 37 mm. Nickel and indium layer have been applied to the copper electrodes beforehand by electrodeposition.

The application of a voltage causes the wafer 5 to be attracted by electrostatic attraction. When operated with a voltage of 300 V, the electrostatic holder according to the exemplary embodiment achieves a force of 6 N, which is sufficient to pick up a wafer.

The gripper may, for example, be mounted on a robot arm and be used to convey, position and bring about any conceivable change in position of the wafer.

I claim:

1. A gripper device for picking up, holding and conveying wafers having a predetermined diameter defined by edges, comprising:
    a carrier plate having a pick-up side for the wafers,
    said carrier plate being made up as a circuit board leads on it;
    at least a pair of gripper elements;
    each of said gripper elements including a first electrode and a second electrode which are connected to said leads;
    said gripper elements being mounted onto said carrier plate and each having a first side arranged as a pick-up side for the wafers, and a second side;
    said first sides of said gripper elements being covered with a first insulating layer that predominantly comprises zirconium oxide, and
    said second sides of said gripper elements being covered with a second insulating layer.

2. The gripper device as claimed in claim 1, wherein said first insulating layer comprises zirconium oxide stabilized with yttrium oxide.

3. The gripper device as claimed in claim 1, wherein said carrier plate is a flexible printed circuit board.

4. The gripper device as claimed in claim 1, wherein said electrodes of said gripper elements have a round shape.

5. The gripper device as claimed in claim 1, wherein said gripper elements have a rectangular shape.

6. The gripper device as claimed in claim 1, wherein said first electrode surrounds said second electrode.

7. The gripper device as claimed in claim 1, further comprising DC voltage supplying means to said leads on said circuit board providing a DC voltage less than 900 V.

8. The gripper device as claimed in claim 1, further comprising DC voltage supplying means to said leads on said circuit board providing a DC voltage less than 600 V.

9. The gripper device as claimed in claim 1, further comprising DC voltage supplying means to said leads on said circuit board providing a DC voltage less than 300 V.

10. The gripper device as claimed in claim 1, further comprising DC voltage supplying and grounding means connectable to said electrodes when a wafer is to be put down.

11. The gripper device as claimed in claim 1, wherein three gripper elements are arranged on a circle and fixed on a said carrier plate.

12. The gripper device as claimed in claim 11, wherein the gripper elements are arranged at approximately 120° degree around the circle.

13. The gripper device as claimed in claim 1, wherein said carrier plate has a pair of finger-shaped extensions, each carrying a gripper element, said gripper elements having a distance from one another which is smaller than the diameter of the wafer such that the wafer picked-up by the gripper device can be lifted from the gripper device at the edges of the wafer.

14. The gripper device as claimed in claim 1, wherein an intermediate layer is for bonding said electrodes and said first insulating layer together.

15. The gripper device as claimed in claim 14, wherein said intermediate layer comprises indium.

16. The gripper device as claimed in claim 14, wherein said intermediate layer comprises nickel.

17. The gripper device as claimed in claim 1, wherein said second insulating layer comprises aluminum (III) oxide.

18. The gripper device as claimed in claim 1, wherein said first insulating layer has a layer thickness in the range between 50 µm and 300 µm.

19. The gripper device as claimed in claim 1, wherein said first insulating layer has a layer thickness below 50 µm.

* * * * *